United States Patent
Bertness et al.

(10) Patent No.: US 7,363,175 B2
(45) Date of Patent: *Apr. 22, 2008

(54) QUERY BASED ELECTRONIC BATTERY TESTER

(75) Inventors: Kevin I. Bertness, Batavia, IL (US); Stephen J. McShane, Oak Brook, IL (US); Wilhelmus H. J. Koster, IJsselstein (NL)

(73) Assignee: Midtronics, Inc., Willowbrook, IL (US)

( * ) Notice: Subject to any disclaimer, the term of this patent is extended or adjusted under 35 U.S.C. 154(b) by 50 days.

This patent is subject to a terminal disclaimer.

(21) Appl. No.: 11/410,263

(22) Filed: Apr. 24, 2006

(65) Prior Publication Data

US 2006/0279287 A1 Dec. 14, 2006

Related U.S. Application Data

(60) Continuation of application No. 11/130,600, filed on May 17, 2005, now Pat. No. 7,034,541, which is a division of application No. 10/675,933, filed on Sep. 30, 2003, now Pat. No. 6,941,234, which is a continuation-in-part of application No. 10/263,473, filed on Oct. 2, 2002, now abandoned.

(60) Provisional application No. 60/415,796, filed on Oct. 3, 2002, provisional application No. 60/415,399, filed on Oct. 2, 2002, provisional application No. 60/330,441, filed on Oct. 17, 2001.

(51) Int. Cl.
  *G01R 31/36* (2006.01)

(52) U.S. Cl. ............... 702/63; 320/134; 320/136; 324/426

(58) Field of Classification Search ............ 320/136, 320/134; 324/426, 427, 429, 434; 702/63; 340/636.1
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,267,452 A | 8/1966 | Wolf | 340/249 |
| 3,356,936 A | 12/1967 | Smith | 324/429 |

(Continued)

FOREIGN PATENT DOCUMENTS

DE  29 26 716 B1  1/1981

(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner*—Carol S. W. Tsai
(74) *Attorney, Agent, or Firm*—Westman, Champlin & Kelly P.A.

(57) ABSTRACT

An electronic battery tester for testing a storage battery provides a test output indicative of a condition of the battery. Electronic measurement circuitry provides a measurement output related to a condition of the battery. The battery condition is determined based upon one or more responses to one or more queries provided to an operator. The responses are used to determine battery type.

29 Claims, 4 Drawing Sheets

U.S. PATENT DOCUMENTS

| | | | | |
|---|---|---|---|---|
| 3,562,634 A | 2/1971 | Latner | | 324/427 |
| 3,593,099 A | 7/1971 | Scholl | | 320/127 |
| 3,607,673 A | 9/1971 | Seyl | | 324/425 |
| 3,652,341 A | 3/1972 | Halsall et al. | | 29/623.2 |
| 3,676,770 A | 7/1972 | Sharaf et al. | | 324/430 |
| 3,729,989 A | 5/1973 | Little | | 73/862.192 |
| 3,750,011 A | 7/1973 | Kreps | | 324/430 |
| 3,753,094 A | 8/1973 | Furuishi et al. | | 324/430 |
| 3,796,124 A | 3/1974 | Crosa | | 411/521 |
| 3,808,522 A | 4/1974 | Sharaf | | 324/430 |
| 3,811,089 A | 5/1974 | Strezelewicz | | 324/170 |
| 3,873,911 A | 3/1975 | Champlin | | 324/430 |
| 3,876,931 A | 4/1975 | Godshalk | | 324/429 |
| 3,886,443 A | 5/1975 | Miyakawa et al. | | 324/426 |
| 3,889,248 A | 6/1975 | Ritter | | 340/636.11 |
| 3,906,329 A | 9/1975 | Bader | | 320/134 |
| 3,909,708 A | 9/1975 | Champlin | | 324/431 |
| 3,936,744 A | 2/1976 | Perlmutter | | 324/772 |
| 3,946,299 A | 3/1976 | Christianson et al. | | 320/430 |
| 3,947,757 A | 3/1976 | Grube et al. | | 324/416 |
| 3,969,667 A | 7/1976 | McWilliams | | 324/427 |
| 3,979,664 A | 9/1976 | Harris | | 324/397 |
| 3,984,762 A | 10/1976 | Dowgiallo, Jr. | | 324/430 |
| 3,984,768 A | 10/1976 | Staples | | 324/712 |
| 3,989,544 A | 11/1976 | Santo | | 429/65 |
| 4,008,619 A | 2/1977 | Alcaide et al. | | 73/724 |
| 4,023,882 A | 5/1977 | Pettersson | | 439/426 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/434 |
| 4,056,764 A | 11/1977 | Endo et al. | | 320/101 |
| 4,070,624 A | 1/1978 | Taylor | | 324/772 |
| 4,086,531 A | 4/1978 | Bernier | | 324/772 |
| 4,106,025 A | 8/1978 | Katz | | 343/715 |
| 4,112,351 A | 9/1978 | Back et al. | | 324/380 |
| 4,114,083 A | 9/1978 | Benham et al. | | 340/636.13 |
| 4,126,874 A | 11/1978 | Suzuki et al. | | 396/301 |
| 4,160,916 A | 7/1979 | Papasideris | | 307/10.6 |
| 4,178,546 A | 12/1979 | Hulls et al. | | 324/772 |
| 4,193,025 A | 3/1980 | Frailing et al. | | 324/427 |
| 4,207,611 A | 6/1980 | Gordon | | 701/33 |
| 4,217,645 A | 8/1980 | Barry et al. | | 702/63 |
| 4,280,457 A | 7/1981 | Bloxham | | 123/198 R |
| 4,297,639 A | 10/1981 | Branham | | 324/429 |
| 4,307,342 A | 12/1981 | Peterson | | 324/767 |
| 4,315,204 A | 2/1982 | Sievers et al. | | 322/28 |
| 4,316,185 A | 2/1982 | Watrous et al. | | 340/636.11 |
| 4,322,685 A * | 3/1982 | Frailing et al. | | 324/429 |
| 4,351,405 A | 9/1982 | Fields et al. | | 180/65.2 |
| 4,352,067 A * | 9/1982 | Ottone | | 324/434 |
| 4,360,780 A * | 11/1982 | Skutch, Jr. | | 324/437 |
| 4,361,809 A | 11/1982 | Bil et al. | | 324/426 |
| 4,363,407 A | 12/1982 | Buckler et al. | | 209/3.3 |
| 4,369,407 A | 1/1983 | Korbell | | 324/416 |
| 4,379,989 A | 4/1983 | Kurz et al. | | 320/165 |
| 4,379,990 A | 4/1983 | Sievers et al. | | 322/99 |
| 4,385,269 A | 5/1983 | Aspinwall et al. | | 320/129 |
| 4,390,828 A | 6/1983 | Converse et al. | | 320/153 |
| 4,392,101 A | 7/1983 | Saar et al. | | 320/156 |
| 4,396,880 A | 8/1983 | Windebank | | 320/156 |
| 4,408,157 A | 10/1983 | Beaubien | | 324/712 |
| 4,412,169 A | 10/1983 | Dell 'Orto | | 320/123 |
| 4,423,378 A | 12/1983 | Marino et al. | | 324/427 |
| 4,423,379 A * | 12/1983 | Jacobs et al. | | 324/429 |
| 4,424,491 A | 1/1984 | Bobbett et al. | | 324/433 |
| 4,459,548 A | 7/1984 | Lentz et al. | | 324/472 |
| 4,514,694 A | 4/1985 | Finger | | 324/429 |
| 4,520,353 A | 5/1985 | McAuliffe | | 340/636.16 |
| 4,521,498 A | 6/1985 | Juergens | | 429/59 |
| 4,564,798 A | 1/1986 | Young | | 320/103 |
| 4,620,767 A | 11/1986 | Woolf | | 439/217 |
| 4,633,418 A | 12/1986 | Bishop | | 702/63 |
| 4,659,977 A | 4/1987 | Kissel et al. | | 320/150 |
| 4,663,580 A | 5/1987 | Wortman | | 320/153 |
| 4,665,370 A | 5/1987 | Holland | | 324/429 |
| 4,667,143 A | 5/1987 | Cooper et al. | | 320/153 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/165 |
| 4,686,442 A | 8/1987 | Radomski | | 320/123 |
| 4,697,134 A | 9/1987 | Burkum et al. | | 320/134 |
| 4,707,795 A | 11/1987 | Alber et al. | | 702/63 |
| 4,709,202 A | 11/1987 | Koenck et al. | | 320/112 |
| 4,710,861 A | 12/1987 | Kanner | | 363/46 |
| 4,719,428 A | 1/1988 | Liebermann | | 324/436 |
| 4,723,656 A * | 2/1988 | Kiernan et al. | | 206/705 |
| 4,743,855 A | 5/1988 | Randin et al. | | 324/430 |
| 4,745,349 A | 5/1988 | Palanisamy et al. | | 320/125 |
| 4,781,629 A | 11/1988 | Mize | | 439/822 |
| 4,816,768 A | 3/1989 | Champlin | | 324/428 |
| 4,820,966 A | 4/1989 | Fridman | | 320/116 |
| 4,825,170 A | 4/1989 | Champlin | | 324/436 |
| 4,847,547 A | 7/1989 | Eng, Jr. et al. | | 320/153 |
| 4,849,700 A | 7/1989 | Morioka et al. | | 324/427 |
| 4,874,679 A * | 10/1989 | Miyagawa | | 429/91 |
| 4,876,495 A | 10/1989 | Palanisamy et al. | | 320/106 |
| 4,881,038 A | 11/1989 | Champlin | | 324/426 |
| 4,888,716 A | 12/1989 | Ueno | | 702/63 |
| 4,907,176 A | 3/1990 | Bahnick et al. | | 364/551.01 |
| 4,912,416 A | 3/1990 | Champlin | | 324/430 |
| 4,913,116 A | 4/1990 | Katogi et al. | | 123/406.32 |
| 4,926,330 A | 5/1990 | Abe et al. | | 701/33 |
| 4,929,931 A | 5/1990 | McCuen | | 340/636.15 |
| 4,931,738 A | 6/1990 | MacIntyre et al. | | 324/435 |
| 4,932,905 A | 6/1990 | Richards | | 439/822 |
| 4,933,845 A | 6/1990 | Hayes | | 710/104 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/129 |
| 4,968,941 A | 11/1990 | Rogers | | 324/428 |
| 4,968,942 A | 11/1990 | Palanisamy | | 324/430 |
| 4,969,834 A | 11/1990 | Johnson | | 439/141 |
| 4,983,086 A | 1/1991 | Hatrock | | 411/259 |
| 5,004,979 A | 4/1991 | Marino et al. | | 324/160 |
| 5,032,825 A | 7/1991 | Kuznicki | | 340/636.15 |
| 5,037,778 A | 8/1991 | Stark et al. | | 228/121 |
| 5,047,722 A | 9/1991 | Wurst et al. | | 324/430 |
| 5,081,565 A | 1/1992 | Nabha et al. | | 362/465 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,126,675 A | 6/1992 | Yang | | 324/435 |
| 5,130,658 A | 7/1992 | Bohmer | | 324/435 |
| 5,140,269 A | 8/1992 | Champlin | | 324/433 |
| 5,144,218 A | 9/1992 | Bosscha | | 320/139 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,168,208 A | 12/1992 | Schultz et al. | | 322/25 |
| 5,170,124 A | 12/1992 | Blair et al. | | 324/434 |
| 5,179,335 A | 1/1993 | Nor | | 320/159 |
| 5,194,799 A | 3/1993 | Tomantschger | | 320/103 |
| 5,204,611 A | 4/1993 | Nor et al. | | 320/145 |
| 5,214,370 A | 5/1993 | Harm et al. | | 320/152 |
| 5,214,385 A | 5/1993 | Gabriel et al. | | 324/434 |
| 5,241,275 A | 8/1993 | Fang | | 324/430 |
| 5,254,952 A | 10/1993 | Salley et al. | | 324/429 |
| 5,266,880 A | 11/1993 | Newland | | 320/125 |
| 5,281,919 A | 1/1994 | Palanisamy | | 324/427 |
| 5,281,920 A | 1/1994 | Wurst | | 324/430 |
| 5,295,078 A | 3/1994 | Stich et al. | | 700/297 |

| | | | | | | |
|---|---|---|---|---|---|---|
| 5,298,797 A | 3/1994 | Redl ................... 327/387 | | 5,675,234 A | 10/1997 | Greene ............... 340/636.11 |
| 5,300,874 A | 4/1994 | Shimamoto et al. ........ 320/106 | | 5,677,077 A | 10/1997 | Faulk .................... 429/90 |
| 5,302,902 A | 4/1994 | Groehl ................... 324/434 | | 5,699,050 A | 12/1997 | Kanazawa ............. 340/636.13 |
| 5,313,152 A | 5/1994 | Wozniak et al. ........... 320/118 | | 5,701,089 A | 12/1997 | Perkins .................. 324/772 |
| 5,315,287 A | 5/1994 | Sol ....................... 340/455 | | 5,705,929 A | 1/1998 | Caravello et al. ........... 324/430 |
| 5,321,626 A | 6/1994 | Palladino ................. 702/63 | | 5,707,015 A * | 1/1998 | Guthrie ................... 241/20 |
| 5,321,627 A | 6/1994 | Reher ..................... 702/63 | | 5,710,503 A | 1/1998 | Sideris et al. .............. 320/116 |
| 5,323,337 A | 6/1994 | Wilson et al. ............... 702/73 | | 5,711,648 A | 1/1998 | Hammerslag ............. 414/800 |
| 5,325,041 A | 6/1994 | Briggs .................... 320/149 | | 5,717,336 A | 2/1998 | Basell et al. ............... 324/427 |
| 5,331,268 A | 7/1994 | Patino et al. ............... 320/158 | | 5,717,937 A | 2/1998 | Fritz ....................... 713/300 |
| 5,336,993 A | 8/1994 | Thomas et al. .......... 324/158.1 | | 5,739,667 A | 4/1998 | Matsuda et al. ............ 320/128 |
| 5,338,515 A | 8/1994 | Dalla Betta et al. ............ 422/95 | | 5,745,044 A | 4/1998 | Hyatt, Jr. et al. ........... 340/5.23 |
| 5,339,018 A | 8/1994 | Brokaw ................... 320/147 | | 5,747,909 A | 5/1998 | Syverson et al. ....... 310/156.56 |
| 5,343,380 A | 8/1994 | Champlin .................. 363/46 | | 5,747,967 A | 5/1998 | Muljadi et al. ............. 320/148 |
| 5,347,163 A | 9/1994 | Yoshimura ................. 307/66 | | 5,754,417 A | 5/1998 | Nicollini ................... 363/60 |
| 5,352,968 A | 10/1994 | Reni et al. ................. 320/136 | | 5,757,192 A | 5/1998 | McShane et al. ............ 324/427 |
| 5,357,519 A | 10/1994 | Martin et al. .............. 371/15.1 | | 5,760,587 A | 6/1998 | Harvey ..................... 324/434 |
| 5,365,160 A | 11/1994 | Leppo et al. ............... 320/160 | | 5,772,468 A | 6/1998 | Kowalski et al. ............ 439/506 |
| 5,365,453 A | 11/1994 | Startup et al. ................ 702/36 | | 5,773,978 A | 6/1998 | Becker ..................... 324/430 |
| 5,369,364 A | 11/1994 | Renirie et al. .............. 324/430 | | 5,780,974 A | 7/1998 | Pabla et al. ................. 315/82 |
| 5,381,096 A | 1/1995 | Hirzel ...................... 324/427 | | 5,780,980 A | 7/1998 | Naito ....................... 318/139 |
| 5,410,754 A | 4/1995 | Klotzbach et al. ........... 370/466 | | 5,789,899 A | 8/1998 | van Phuoc et al. .......... 320/112 |
| 5,412,308 A | 5/1995 | Brown ..................... 323/267 | | 5,793,359 A | 8/1998 | Ushikubo .................. 345/169 |
| 5,412,323 A | 5/1995 | Kato et al. ................. 324/429 | | 5,796,239 A | 8/1998 | van Phuoc et al. .......... 320/107 |
| 5,426,371 A | 6/1995 | Salley et al. ............... 324/429 | | 5,808,469 A | 9/1998 | Kopera ..................... 324/434 |
| 5,426,416 A | 6/1995 | Jefferies et al. ............. 340/664 | | 5,811,979 A | 9/1998 | Rhein ...................... 324/718 |
| 5,432,025 A * | 7/1995 | Cox ........................ 429/65 | | 5,818,234 A | 10/1998 | McKinnon .................. 324/433 |
| 5,432,426 A | 7/1995 | Yoshida .................... 320/160 | | 5,821,756 A | 10/1998 | McShane et al. ............ 324/430 |
| 5,434,495 A | 7/1995 | Toko ....................... 320/135 | | 5,821,757 A | 10/1998 | Alvarez et al. .............. 324/434 |
| 5,435,185 A | 7/1995 | Eagan ...................... 73/587 | | 5,825,174 A | 10/1998 | Parker ...................... 324/106 |
| 5,442,274 A | 8/1995 | Tamai ...................... 320/146 | | 5,831,435 A | 11/1998 | Troy ....................... 324/426 |
| 5,445,026 A | 8/1995 | Eagan ...................... 73/591 | | 5,850,113 A | 12/1998 | Weimer et al. .............. 307/125 |
| 5,449,996 A | 9/1995 | Matsumoto et al. .......... 320/148 | | 5,862,515 A | 1/1999 | Kobayashi et al. ........... 702/63 |
| 5,449,997 A | 9/1995 | Gilmore et al. ............. 320/148 | | 5,865,638 A | 2/1999 | Trafton ..................... 439/288 |
| 5,451,881 A | 9/1995 | Finger ..................... 324/433 | | 5,872,443 A | 2/1999 | Williamson ................ 320/160 |
| 5,453,027 A | 9/1995 | Buell et al. ................. 439/433 | | 5,872,453 A | 2/1999 | Shimoyama et al. ......... 324/431 |
| 5,457,377 A | 10/1995 | Jonsson .................... 324/430 | | 5,895,440 A | 4/1999 | Proctor et al. ............... 702/63 |
| 5,469,043 A | 11/1995 | Cherng et al. .............. 320/161 | | 5,903,154 A | 5/1999 | Zhang et al. ............... 324/437 |
| 5,485,090 A | 1/1996 | Stephens ................... 324/433 | | 5,903,716 A | 5/1999 | Kimber et al. .............. 395/114 |
| 5,488,300 A | 1/1996 | Jamieson ................... 324/432 | | 5,912,534 A | 6/1999 | Benedict ................... 315/82 |
| 5,519,383 A | 5/1996 | De La Rosa ........... 340/636.15 | | 5,914,605 A | 6/1999 | Bertness ................... 324/430 |
| 5,528,148 A | 6/1996 | Rogers ..................... 320/137 | | 5,927,938 A | 7/1999 | Hammerslag ............... 414/809 |
| 5,537,967 A | 7/1996 | Tashiro et al. .............. 123/192.1 | | 5,929,609 A | 7/1999 | Joy et al. .................... 322/25 |
| 5,541,489 A | 7/1996 | Dunstan .................... 320/134 | | 5,939,855 A | 8/1999 | Proctor et al. ............... 320/104 |
| 5,546,317 A | 8/1996 | Andrieu .................... 702/63 | | 5,939,861 A | 8/1999 | Joko et al. .................. 320/122 |
| 5,548,273 A | 8/1996 | Nicol et al. ................. 340/439 | | 5,945,829 A | 8/1999 | Bertness ................... 324/430 |
| 5,550,485 A | 8/1996 | Falk ........................ 324/772 | | 5,951,229 A | 9/1999 | Hammerslag ............... 414/398 |
| 5,561,380 A | 10/1996 | Sway-Tin et al. ............ 324/509 | | 5,961,561 A | 10/1999 | Wakefield, II .............. 701/29 |
| 5,562,501 A | 10/1996 | Kinoshita et al. ............ 439/852 | | 5,961,604 A | 10/1999 | Anderson et al. ............ 709/229 |
| 5,563,496 A | 10/1996 | McClure ................... 320/128 | | 5,969,625 A | 10/1999 | Russo .................... 340/636.19 |
| 5,572,136 A | 11/1996 | Champlin .................. 324/426 | | 5,978,805 A | 11/1999 | Carson ..................... 707/10 |
| 5,574,355 A | 11/1996 | McShane et al. ............ 320/161 | | 5,982,138 A | 11/1999 | Krieger .................... 320/105 |
| 5,578,915 A | 11/1996 | Crouch, Jr. et al. .......... 324/428 | | 6,002,238 A | 12/1999 | Champlin .................. 320/134 |
| 5,583,416 A | 12/1996 | Klang ...................... 320/160 | | 6,005,759 A | 12/1999 | Hart et al. ................... 361/66 |
| 5,585,728 A | 12/1996 | Champlin .................. 324/427 | | 6,008,652 A * | 12/1999 | Theofanopoulos et al. . 324/434 |
| 5,589,757 A | 12/1996 | Klang ...................... 320/160 | | 6,009,369 A | 12/1999 | Boisvert et al. ............. 701/99 |
| 5,592,093 A | 1/1997 | Klingbiel ................... 324/426 | | 6,016,047 A | 1/2000 | Notten et al. ............... 320/137 |
| 5,592,094 A | 1/1997 | Ichikawa ................... 324/427 | | 6,031,354 A * | 2/2000 | Wiley et al. ................ 320/116 |
| 5,596,260 A | 1/1997 | Moravec et al. ............. 320/135 | | 6,031,368 A | 2/2000 | Klippel et al. .............. 324/133 |
| 5,598,098 A | 1/1997 | Champlin .................. 324/430 | | 6,037,751 A | 3/2000 | Klang ...................... 320/160 |
| 5,602,462 A | 2/1997 | Stich et al. ................. 323/258 | | 6,037,777 A | 3/2000 | Champlin .................. 324/430 |
| 5,606,242 A | 2/1997 | Hull et al. .................. 320/106 | | 6,037,778 A | 3/2000 | Makhija .................... 324/433 |
| 5,614,788 A | 3/1997 | Mullins et al. .............. 315/82 | | 6,046,514 A | 4/2000 | Rouillard et al. ............. 307/77 |
| 5,621,298 A | 4/1997 | Harvey ..................... 320/134 | | 6,051,976 A | 4/2000 | Bertness ................... 324/426 |
| 5,633,985 A | 5/1997 | Severson et al. ............ 704/267 | | 6,055,468 A | 4/2000 | Kaman et al. ............... 701/29 |
| 5,637,978 A | 6/1997 | Kellett et al. ............... 320/104 | | 6,061,638 A | 5/2000 | Joyce ....................... 702/63 |
| 5,642,031 A | 6/1997 | Brotto ...................... 320/156 | | 6,064,372 A | 5/2000 | Kahkoska ................. 345/173 |
| 5,650,937 A | 7/1997 | Bounaga .................... 702/65 | | 6,072,299 A | 6/2000 | Kurle et al. ................ 320/112 |
| 5,652,501 A | 7/1997 | McClure et al. ......... 340/636.15 | | 6,072,300 A | 6/2000 | Tsuji ....................... 320/116 |
| 5,653,659 A | 8/1997 | Kunibe et al. .............. 477/111 | | 6,081,098 A | 6/2000 | Bertness et al. ............. 320/134 |
| 5,654,623 A | 8/1997 | Shiga et al. ................ 320/106 | | 6,081,109 A | 6/2000 | Seymour et al. ............. 324/127 |
| 5,656,920 A | 8/1997 | Cherng et al. .............. 324/431 | | 6,091,238 A | 7/2000 | McDermott ............. 324/207.2 |
| 5,661,368 A | 8/1997 | Deol et al. ................. 315/82 | | 6,091,245 A | 7/2000 | Bertness ................... 324/426 |

| | | | | | | | |
|---|---|---|---|---|---|---|---|
| 6,094,033 A | 7/2000 | Ding et al. | 320/132 | 6,556,019 B2 | 4/2003 | Bertness | 324/426 |
| 6,100,670 A | 8/2000 | Levesque | 320/150 | 6,566,883 B1 | 5/2003 | Vonderhaar et al. | 324/426 |
| 6,104,167 A | 8/2000 | Bertness et al. | 320/132 | 6,570,385 B1 | 5/2003 | Roberts et al. | 324/378 |
| 6,114,834 A | 9/2000 | Parise | 320/109 | 6,577,107 B2 | 6/2003 | Kechmire | 320/139 |
| 6,137,269 A | 10/2000 | Champlin | 320/150 | 6,586,941 B2 | 7/2003 | Bertness et al. | 324/426 |
| 6,140,797 A | 10/2000 | Dunn | 320/105 | 6,597,150 B1 | 7/2003 | Bertness et al. | 320/104 |
| 6,144,185 A | 11/2000 | Dougherty et al. | 320/132 | 6,600,815 B1 | 7/2003 | Walding | 379/93.07 |
| 6,150,793 A | 11/2000 | Lesesky et al. | 320/104 | 6,618,644 B2 | 9/2003 | Bean | 700/231 |
| 6,158,000 A | 12/2000 | Collins | 713/1 | 6,621,272 B2 | 9/2003 | Champlin | 324/426 |
| 6,161,640 A | 12/2000 | Yamaguchi | 180/65.8 | 6,623,314 B1 | 9/2003 | Cox et al. | 439/759 |
| 6,163,156 A | 12/2000 | Bertness | 324/426 | 6,628,011 B2 | 9/2003 | Droppo et al. | 307/43 |
| 6,167,349 A | 12/2000 | Alvarez | 702/63 | 6,629,054 B2 | 9/2003 | Makhija et al. | 702/113 |
| 6,172,483 B1 | 1/2001 | Champlin | 320/134 | 6,633,165 B2 | 10/2003 | Bertness | 324/426 |
| 6,172,505 B1 | 1/2001 | Bertness | 324/430 | 6,667,624 B1 | 12/2003 | Raichle et al. | 324/522 |
| 6,181,545 B1 | 1/2001 | Amatucci et al. | 361/502 | 6,679,212 B2 | 1/2004 | Kelling | 123/179.28 |
| 6,211,651 B1 | 4/2001 | Nemoto | 320/133 | 6,686,542 B2 | 2/2004 | Zhang | 174/74 |
| 6,215,275 B1 | 4/2001 | Bean | 320/106 | 6,696,819 B2 | 2/2004 | Bertness | 320/134 |
| 6,222,342 B1 | 4/2001 | Eggert et al. | 320/105 | 6,707,303 B2 | 3/2004 | Bertness et al. | 324/426 |
| 6,222,369 B1 | 4/2001 | Champlin | 324/430 | 6,737,831 B2 | 5/2004 | Champlin | 320/132 |
| D442,503 S | 5/2001 | Lundbeck et al. | D10/77 | 6,759,849 B2 | 7/2004 | Bertness | 324/426 |
| 6,225,808 B1 | 5/2001 | Varghese et al. | 324/426 | 6,777,945 B2 | 8/2004 | Roberts et al. | 324/426 |
| 6,236,332 B1 | 5/2001 | Conkright et al. | 340/3.1 | 6,781,382 B2 | 8/2004 | Johnson | 324/426 |
| 6,238,253 B1 | 5/2001 | Qualls | 439/759 | 6,784,637 B2 | 8/2004 | Raichle et al. | 320/107 |
| 6,242,887 B1 | 6/2001 | Burke | 320/104 | 6,788,025 B2 | 9/2004 | Bertness et al. | 320/104 |
| 6,249,124 B1 | 6/2001 | Bertness | 324/426 | 6,795,782 B2 | 9/2004 | Bertness et al. | 702/63 |
| 6,250,973 B1 | 6/2001 | Lowery et al. | 439/763 | 6,805,090 B2 | 10/2004 | Bertness et al. | 123/198 |
| 6,254,438 B1 | 7/2001 | Gaunt | 439/755 | 6,806,716 B2 | 10/2004 | Bertness et al. | 324/426 |
| 6,259,170 B1 | 7/2001 | Limoge et al. | 307/10.8 | 6,825,669 B2 | 11/2004 | Raichle et al. | 324/426 |
| 6,259,254 B1 | 7/2001 | Klang | 324/427 | 6,842,707 B2 | 1/2005 | Raichle et al. | 702/62 |
| 6,262,563 B1 | 7/2001 | Champlin | 320/134 | 6,850,037 B2 | 2/2005 | Bertness | 320/132 |
| 6,263,268 B1 | 7/2001 | Nathanson | 701/29 | 6,871,151 B2 | 3/2005 | Bertness | 702/63 |
| 6,271,643 B1 | 8/2001 | Becker et al. | 320/112 | 6,885,195 B2 | 4/2005 | Bertness | 324/426 |
| 6,275,008 B1 | 8/2001 | Arai et al. | 320/132 | 6,888,468 B2 | 5/2005 | Bertness | 340/636.15 |
| 6,294,896 B1 | 9/2001 | Champlin | 320/134 | 6,891,378 B2 | 5/2005 | Bertness et al. | 324/426 |
| 6,294,897 B1 | 9/2001 | Champlin | 320/153 | 6,904,796 B2 | 6/2005 | Pacsai et al. | 73/146.8 |
| 6,304,087 B1 | 10/2001 | Bertness | 324/426 | 6,906,522 B2 | 6/2005 | Bertness et al. | 324/426 |
| 6,307,349 B1 | 10/2001 | Koenck et al. | 320/112 | 6,906,523 B2 | 6/2005 | Bertness et al. | 324/426 |
| 6,310,481 B2 | 10/2001 | Bertness | 324/430 | 6,906,624 B2 | 6/2005 | McClelland et al. | 340/442 |
| 6,313,607 B1 | 11/2001 | Champlin | 320/132 | 6,909,287 B2 | 6/2005 | Bertness | 324/427 |
| 6,313,608 B1 | 11/2001 | Varghese et al. | 320/132 | 6,913,483 B2 | 7/2005 | Restaino et al. | 439/504 |
| 6,316,914 B1 * | 11/2001 | Bertness | 320/134 | 6,914,413 B2 | 7/2005 | Bertness et al. | 320/104 |
| 6,323,650 B1 | 11/2001 | Bertness et al. | 324/426 | 6,919,725 B2 | 7/2005 | Bertness et al. | 324/433 |
| 6,329,793 B1 | 12/2001 | Bertness et al. | 320/132 | 6,930,485 B2 | 8/2005 | Bertness et al. | 324/426 |
| 6,331,762 B1 | 12/2001 | Bertness | 320/134 | 6,941,234 B2 | 9/2005 | Bertness et al. | 702/63 |
| 6,332,113 B1 * | 12/2001 | Bertness | 702/63 | 7,034,541 B2 | 4/2006 | Bertness et al. | 324/426 |
| 6,346,795 B2 | 2/2002 | Haraguchi et al. | 320/136 | 2002/0010558 A1 | 1/2002 | Bertness et al. | 702/63 |
| 6,347,958 B1 | 2/2002 | Tsai | 439/488 | 2002/0030495 A1 * | 3/2002 | Kechmire | 324/427 |
| 6,351,102 B1 | 2/2002 | Troy | 320/139 | 2002/0171428 A1 | 11/2002 | Bertness | 702/63 |
| 6,356,042 B1 | 3/2002 | Kahlon et al. | 318/138 | 2002/0176010 A1 | 11/2002 | Wallach et al. | 348/362 |
| 6,359,441 B1 | 3/2002 | Bertness | 324/426 | 2003/0025481 A1 | 2/2003 | Bertness | 324/427 |
| 6,359,442 B1 | 3/2002 | Henningson et al. | 324/426 | 2003/0036909 A1 | 2/2003 | Kato | 704/275 |
| 6,363,303 B1 | 3/2002 | Bertness | 701/29 | 2003/0088375 A1 | 5/2003 | Bertness et al. | 702/63 |
| RE37,677 E | 4/2002 | Irie | 315/83 | 2003/0184262 A1 | 10/2003 | Makhija | 320/156 |
| 6,384,608 B1 | 5/2002 | Namaky | 324/430 | 2003/0184306 A1 | 10/2003 | Bertness et al. | 324/426 |
| 6,388,448 B1 | 5/2002 | Cervas | 324/426 | 2003/0194672 A1 | 10/2003 | Roberts et al. | 431/196 |
| 6,392,414 B2 | 5/2002 | Bertness | 324/429 | 2004/0000590 A1 | 1/2004 | Raichle et al. | 235/462.01 |
| 6,396,278 B1 | 5/2002 | Makhija | 324/402 | 2004/0000893 A1 | 1/2004 | Raichle et al. | 320/135 |
| 6,411,098 B1 | 6/2002 | Laletin | 324/436 | 2004/0002824 A1 | 1/2004 | Raichle et al. | 702/63 |
| 6,417,669 B1 | 7/2002 | Champlin | 324/426 | 2004/0002825 A1 | 1/2004 | Raichle et al. | 702/63 |
| 6,424,157 B1 | 7/2002 | Gollomp et al. | 324/430 | 2004/0002836 A1 * | 1/2004 | Raichle et al. | 702/188 |
| 6,424,158 B2 * | 7/2002 | Klang | 324/433 | 2004/0049361 A1 | 3/2004 | Hamdan et al. | 702/115 |
| 6,441,585 B1 | 8/2002 | Bertness | 320/132 | 2004/0051533 A1 | 3/2004 | Namaky | 324/426 |
| 6,445,158 B1 | 9/2002 | Bertness et al. | 320/104 | 2004/0054503 A1 | 3/2004 | Namaky | 702/182 |
| 6,449,726 B1 | 9/2002 | Smith | 713/340 | 2004/0113588 A1 | 6/2004 | Mikuriya et al. | 320/128 |
| 6,456,045 B1 | 9/2002 | Troy et al. | 320/139 | 2004/0145342 A1 | 7/2004 | Lyon | 320/108 |
| 6,466,025 B1 | 10/2002 | Klang | 324/429 | 2005/0254106 A9 | 11/2005 | Silverbrook et al. | 358/539 |
| 6,466,026 B1 | 10/2002 | Champlin | 324/430 | | | | |
| 6,469,511 B1 | 10/2002 | Vonderhaar et al. | 324/425 | | | | |
| 6,495,990 B2 | 12/2002 | Champlin | 320/132 | | | | |
| 6,526,361 B1 | 2/2003 | Jones et al. | 702/63 | EP | 0 022 450 A1 | 1/1981 | |
| 6,531,848 B1 | 3/2003 | Chitsazan et al. | 320/153 | EP | 0 637 754 A1 | 2/1995 | |
| 6,534,993 B2 | 3/2003 | Bertness | 324/433 | EP | 0 772 056 A1 | 5/1997 | |
| 6,544,078 B2 | 4/2003 | Palmisano et al. | 439/762 | FR | 2 749 397 | 12/1997 | |

FOREIGN PATENT DOCUMENTS

| | | |
|---|---|---|
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 00/16083 | 3/2000 |
| WO | WO 00/62049 | 10/2000 |
| WO | WO 00/67359 | 11/2000 |
| WO | WO 01/59443 | 2/2001 |
| WO | WO 01/16614 | 3/2001 |
| WO | WO 01/16615 | 3/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"Battery Impedance", by E. Willihnganz et al., *Electrical Engineering*, Sep. 1959, pp. 922-925.

"Determining The End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/ Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Willihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.

"Notification of Transmittal of The International Search Report or the Declaration", PCT/US02/29461.

"Notification of Transmittal of The International Search Report or the Declaration", PCT/US03/07546.

"Notification of Transmittal of The International Search Report or the Declaration", PCT/US03/06577.

"Improved Impedance Spectroscopy Technique For Status Determination of Production Li/SO$_2$ Batteries" Terrill Atwater et al., pp. 10-113, (1992).

"Notification of Transmittal of The International Search Report or the Declaration", PCT/US03/41561.

"Notification of Transmittal of The International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois, pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23$^{rd}$ International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, INDUCTANCE, 2005, http://en.wikipedia.org/wiki/inductance, pp. 1-5, mutual Inductance, pp. 3,4.

* cited by examiner

QUERY BASED ELECTRONIC BATTERY TESTER

The present application is a Continuation of Ser. No. 11/130,600, filed May 17, 2005, now U.S. Pat. No. 7,034,541 which is a Divisional of U.S. application Ser. No. 10/675,933, filed Sep. 30, 2003, now U.S. Pat. No. 6,941,234 which claims the benefit of U.S. provisional patent application Ser. No. 60/415,399, filed Oct. 2, 2002, and Ser. No. 60/415,796, filed Oct. 3, 2002, and 10/675,933 is also a Continuation-In-Part of U.S. Ser. No. 10/263,473, filed Oct. 2, 2002, now abandoned which claims the benefit of Ser. No. 60/330,441, filed Oct. 17 , 2001, the contents of which are hereby incorporated by reference in their entirety.

BACKGROUND OF THE INVENTION

The present invention relates to measuring the condition of storage batteries. More specifically, the present invention relates to electronic battery testers which measure condition of storage batteries.

Electronic battery testers are used to test storage batteries. Various examples of such testers are described in U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued June 22, 1999, entitled ELECTRONIC BATTERY TESTER; U.S. Pat. No.3,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Ser. No. 09/780,146,filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/379,281, filed May 8, 2002, entitled METHOD FOR DETERMINING BATTERY STATE OF CHARGE; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, U.S. Ser. No. 10/388,855, filed Mar. 14, 2003, entitled ELECTRONIC BATTERY TESTER WITH BATTERY FAILURE TEMPERATURE DETERMINATION, U.S. Ser. No. 10/396,550, filed Mar. 25, 2003, entitled ELECTRONIC BATTERY TESTER, U.S. Ser. No. 60/467,872, filed May 5, 2003, entitled METHOD FOR DETERMINING BATTERY STATE OF CHARGE, U.S. Ser. No. 60/477,082, filed Jun. 9, 2003, entitled ALTERNATOR TESTER, U.S. Ser. No. 10/460,749, filed Jun. 12, 2003, entitled MODULAR BATTERY TESTER FOR SCAN TOOL, U.S. Ser. No. 10/462,323, filed Jun. 16, 2003, entitled ELECTRONIC BATTERY TESTER HAVING A USER INTERFACE TO CONFIGURE A PRINTER, U.S. Ser. No. 10/601,608, filed Jun. 23, 2003, entitled CABLE FOR ELECTRONIC BATTERY TESTER, U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE, U.S. Ser. No. 10/653,342, filed Sep. 2, 2003, entitled ELECTRONIC BATTERY TESTER CONFIGURED TO PREDICT A LOAD TEST RESULT, U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY, U.S. Ser. No. 10/656,526, filed Sep. 5, 2003, entitled METHOD AND APPARATUS FOR MEASURING A PARAMETER OF A VEHICLE ELECTRICAL SYSTEM, U.S. Ser. No. 10/656,538, filed Sep. 5, 2003, entitled ALTERNATOR TESTER WITH ENCODED OUTPUT, which are incorporated herein in their entirety.

It is known that the condition of a battery can be provided by comparing a rating of the battery with a measured value. However, other techniques for providing a battery test could provide additional information regarding battery condition.

SUMMARY OF THE INVENTION

A method and apparatus for testing a storage battery provides a test output indicative of a condition of the battery. A condition of the battery is determined based upon at least one response of an operator to at least one query and a measured parameter of the battery.

DETAILED DESCRIPTION OF THE PREFERRED EMBODIMENTS

Figure 1:
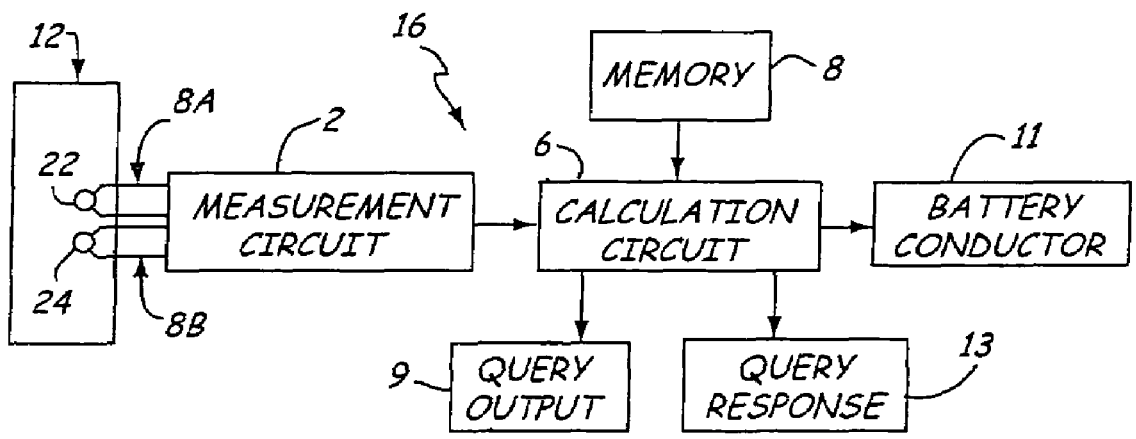
FIG. 1 is a simplified block diagram of an electronic battery tester in accordance with the present invention.

FIG. 1 is a simplified block diagram of electronic battery tester 16 in accordance with the present invention. Apparatus 16 is shown coupled to battery 12 which includes a positive battery terminal 22 and a negative battery terminal 24. Battery 12 is a storage battery having a plurality of individual cells and a voltage such as 12.6 volts, 48 volts, etc.

FIG. 1 operates in accordance with the present invention and includes electronic test circuitry 2 which is configured to measure a parameter of battery 12 through first and second connections 8A and 8B. In one embodiment, circuitry 2 is dynamic parameter parameter measurement circuitry configured to measure a dynamic parameter of battery 12 through Kelvin connections 8A and 8B. Dynamic parameter measurement circuitry 2 can measure a dynamic parameter, that is a parameter which is a function of a signal with a time varying component, of battery 12 and provide a measurement output 4 to calculation circuitry 6. Example dynamic parameters include dynamic conductance, resistance, reactance, susceptance, and their combinations. Calculation circuitry 6 receives the dynamic parameter output 4. In some embodiments, circuitry applies a load test which may or may not also include measuring a dynamic parameter. In an load test, the Kelvin connections may not be required.

A memory 8 is coupled to calculation circuitry 6 and contains a plurality of user queries related to battery condition and a plurality of query relationships which relate to a response from a user to one or more queries and to the measurement output from the measurement circuitry 2. A query is provided to a user through query output 9 as explained in greater detail below. A query response is received from the user through query response input 13 and provided to calculation circuitry 6. Based upon the relationship stored in memory 8, the query response, and the measurement output 4, calculation circuitry 6 determines a battery condition. This condition is based upon at least one of the plurality of query relationships stored in memory 8. The query relationships can be in the form of a decision tree which identifies a particular battery type based upon the query response(s). he battery condition can also be a function of an optional battery rating received through an input, for example the same input 13 used to receive the query response. Calculation circuitry 6 provides a battery condition output 11. The output 11 can be output to other circuitry or displayed locally, for example on output 9.

In various aspects of the invention, the battery test output can be various relative or absolute indications of a battery's condition. The output can be pass/fail, percent charged related to battery state of health, capacity, or other output related to battery condition.

Figure 2:
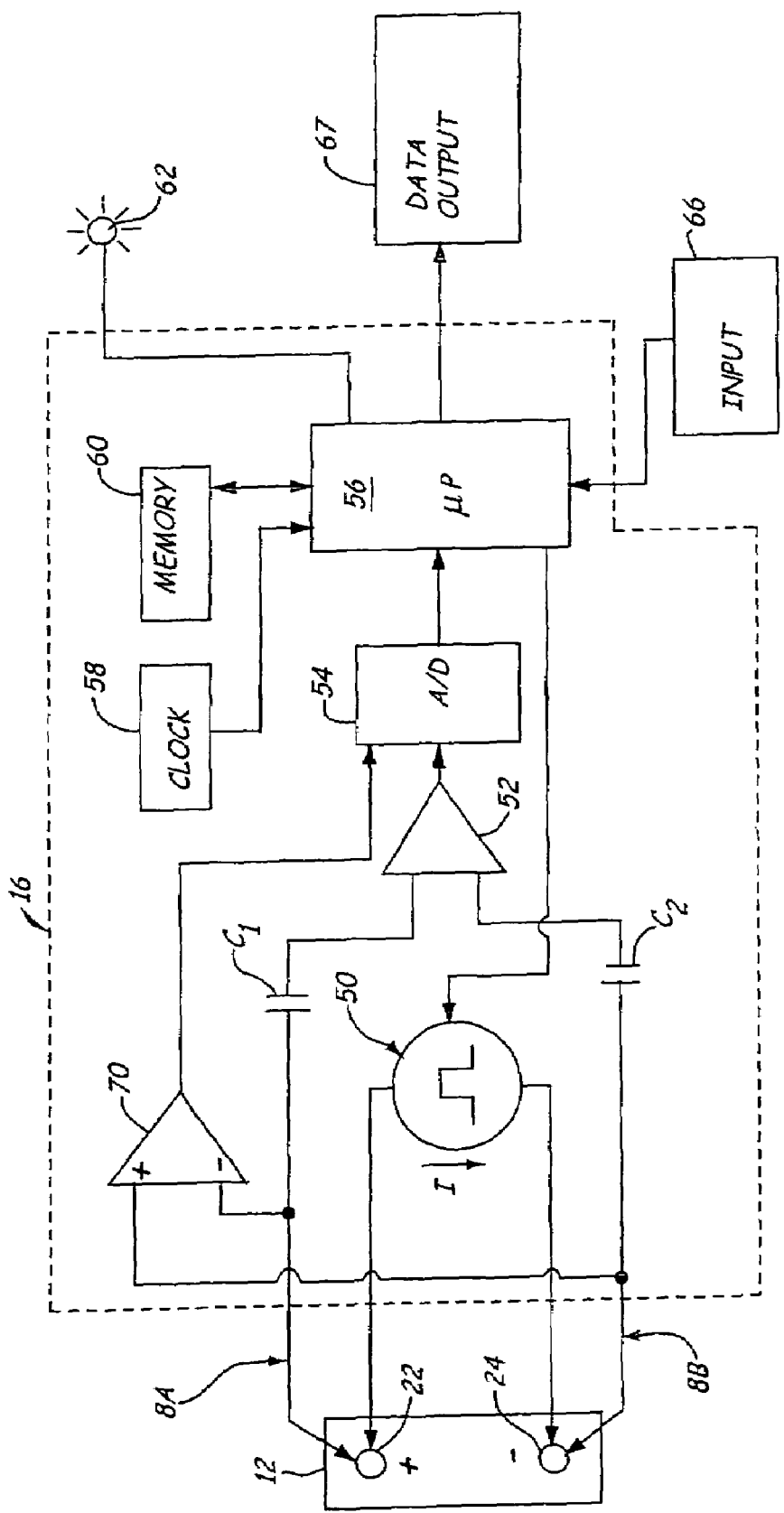
FIG. 2 is a more detailed block diagram of the battery tester of FIG. 1.

FIG. 2 is a more detailed block diagram of circuitry 16 which operates in accordance with one embodiment of the present invention and determines a dynamic parameter such as the conductance ($G_{BAT}$) of battery 12 and the voltage potential ($V_{BAT}$) between terminals 22 and 24 of battery 12. Circuitry 16 includes a forcing function (such as current source 50), differential amplifier 52, analog-to-digital converter 54 and microprocessor 56. In this embodiment, dynamic parameter measurement circuitry 2 shown in FIG. 1 generally comprises source 50, amplifier 52, analog to digital converter 54, amplifier 70 and microprocessor 56. Calculation circuitry 6 generally comprises microprocessor 56. The general blocks shown in FIG. 1 can be implemented as desired and are not limited to the configurations shown in FIG. 2. Amplifier 52 is illustrated as capacitively coupled to battery 12 through capacitors $C_1$ and $C_2$. Amplifier 52 has an output connected to an input of analog-to-digital converter 54. Microprocessor 56 is connected to system clock 58, memory 60, pass/fail indicator 62 and analog-to-digital converter 54. Microprocessor 56 is also capable of receiving an input from input device 66. The input can be the query response input 13, a rating of the battery, or other data as desired. Output 67 can be a local display for displaying queries, battery condition, etc.

In operation, current source 50 is controlled by microprocessor 56 and provides a current in the direction shown by the arrow in FIG. 2. This can be any type of time varying signal. Source 50 can be an active source or a passive source such as a resistance. Differential amplifier 52 is connected to terminals 22 and 24 of battery 12 through capacitors $C_1$ and $C_2$, respectively, and provides an output related to the voltage potential difference between terminals 22 and 24. In a preferred embodiment, amplifier 52 has a high input impedance. Circuitry 16 includes differential amplifier 70 having inverting and noninverting inputs connected to terminals 24 and 22, respectively. Amplifier 70 is connected to measure the open circuit potential voltage ($V_{BAT}$) of battery 12 between terminals 22 and 24. The output of amplifier 70 is provided to analog-to-digital converter 54 such that the voltage across terminals 22 and 24 can be measured by microprocessor 56.

Circuitry 16 is connected to battery 12 through a four-point connection technique known as a Kelvin connection. This Kelvin connection allows current I to be injected into battery 12 through a first pair of terminals while the voltage V across the terminals 22 and 24 is measured by a second pair Kof connections. Because very little current flows through amplifier 52, the voltage drop across the inputs to amplifier 52 is substantially identical to the voltage drop across terminals 22 and 24 of battery 12. The Kelvin connections can be "split" and do not all need to be connected directly to the battery terminals 22 and 24. The output of differential amplifier 52 is converted to a digital format and is provided to microprocessor 56. Microprocessor 56 operates at a frequency determined by system clock 58 and in accordance with programming instructions stored in memory 60. Memory 60 can also store the relationship tree used to identify battery types.

Microprocessor 56 determines the conductance of battery 12 by applying a current pulse I using current source 50. This can be, for example, by selectively applying a load such as a resistance. The microprocessor determines the change in battery voltage due to the current pulse I using amplifier 52 and analog-to-digital converter 54. The value of current I generated by current source 50 is known and is stored in memory 60. In one embodiment, current I is obtained by applying a load to battery 12. Microprocessor 56 calculates the dynamic conductance of battery 12 using the following equation:

$$\text{Conductance} = G_{BAT} = \frac{\Delta I}{\Delta V} \qquad \text{Equation 1}$$

where ΔI is the change in current flowing through battery 12 due to current source 50 and ΔV is the change in battery voltage due to applied current ΔI.

Microprocessor 56 operates in accordance with the present invention and determines a condition of battery 12 based upon a determination of the type of battery obtained through query responses. The data output can be a visual display or other device for providing information to an operator and/or can be an output provided to other circuitry.

Figure 3:
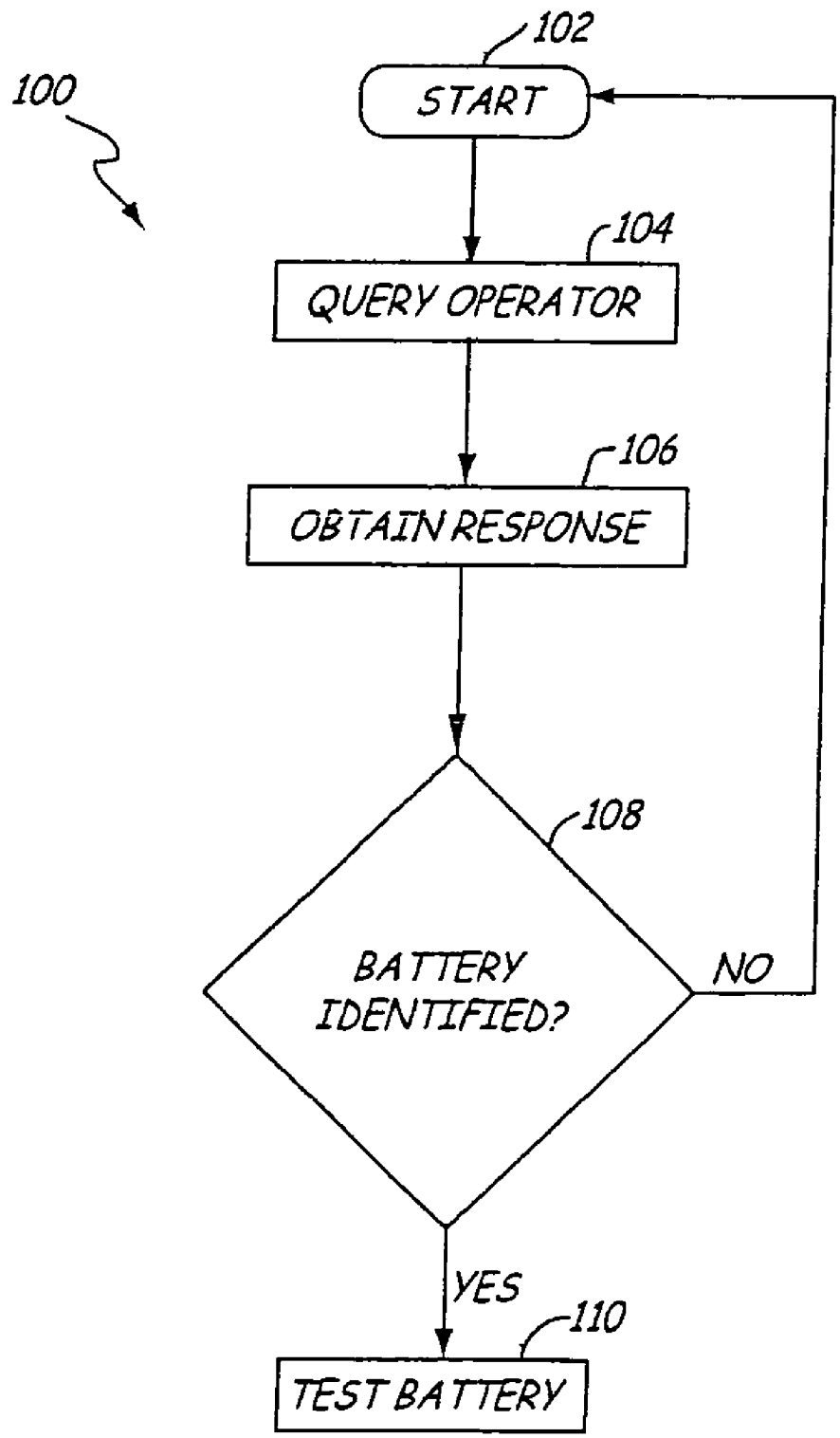
FIG. 3 is a simplified flow chart showing steps in accordance with the present invention.

FIG. 3 is a flow chart 100 showing operation of microprocessor 56 based upon programming instructions stored in memory 60. Block diagram 100 begins at start block 102. At block 104, a query is provided to the operator. This can be, for example, retrieved from memory 6. At block 106, the query response is obtained. At block 108, if the query response has not led to an identification of battery type, control is passed to block 104 and further query responses are obtained. Once the battery type is identified, control is passed to block 108 and the battery is tested at block 110 as a function of dynamic parameter and the determined battery type.

Some prior art battery testers have compared a battery measurement to a fixed value, such as a rating of the battery in order to provide a relative output. For example, by comparing a measured value of the battery with the rating of the battery, an output can be provided which is a percentage based upon a ratio of the measured value to the rated value. However, the present invention recognizes that in some instances it may be desirable to provide a battery test which is a function of battery type.

As used herein, a dynamic parameter of the battery is a parameter which has been measured using an applied signal (either passively or actively) with a time varying component. Example dynamic parameters include dynamic resistance, conductance, reactance, susceptance and there combinations both real, imaginary and combinations.

Based upon the measured dynamic parameter and the determined battery type, a test output is provided. Examples of a test outputs include an end of life prediction for the battery which can be in the form of months, seasons or other forms; a state of health or state of charge determination; a predicted number of engine starts of the vehicle which the battery can perform; a predicted number of charge and discharge cycles which the battery is capable of experiencing, a prediction of time to reach an end voltage based upon current draw and temperature; a predicted time to charge the battery based upon charge current and temperature; a prediction of the largest current at which a load test applied to the battery can be passed; a prediction of the reserve capacity of the battery; a prediction of the number of amp-hours remaining in the battery, or others.

The test output can be shown on a display, used to provide pass/fail information or passed along the other circuitry.

Battery tester 16 is configured to test a number of different types of storage batteries. The queries contained in memory 8 (or 60) can relate to questions which will yield answers from an operator which are indicative of a particular type of battery. For example, the circuitry 6 can query an operator with questions related to the presence, number, or configuration of vent caps present on a battery. The presence and location of any hoses connected to the battery, particular visible markings or colors of the battery, particular brand information of the battery, etc. Based upon the response to these queries, memory 8 contains a relationship tree which indicates a particular algorithm for use by calculation circuitry in testing the battery. For example, if the responses to the queries indicate that the battery is a flooded battery, the test algorithm which is selected may be different than if the query responses indicate that S the battery is a gel cell type battery. In general, such queries can be related to the physical construction of the battery which can be observed by an operator.

Figure 4:
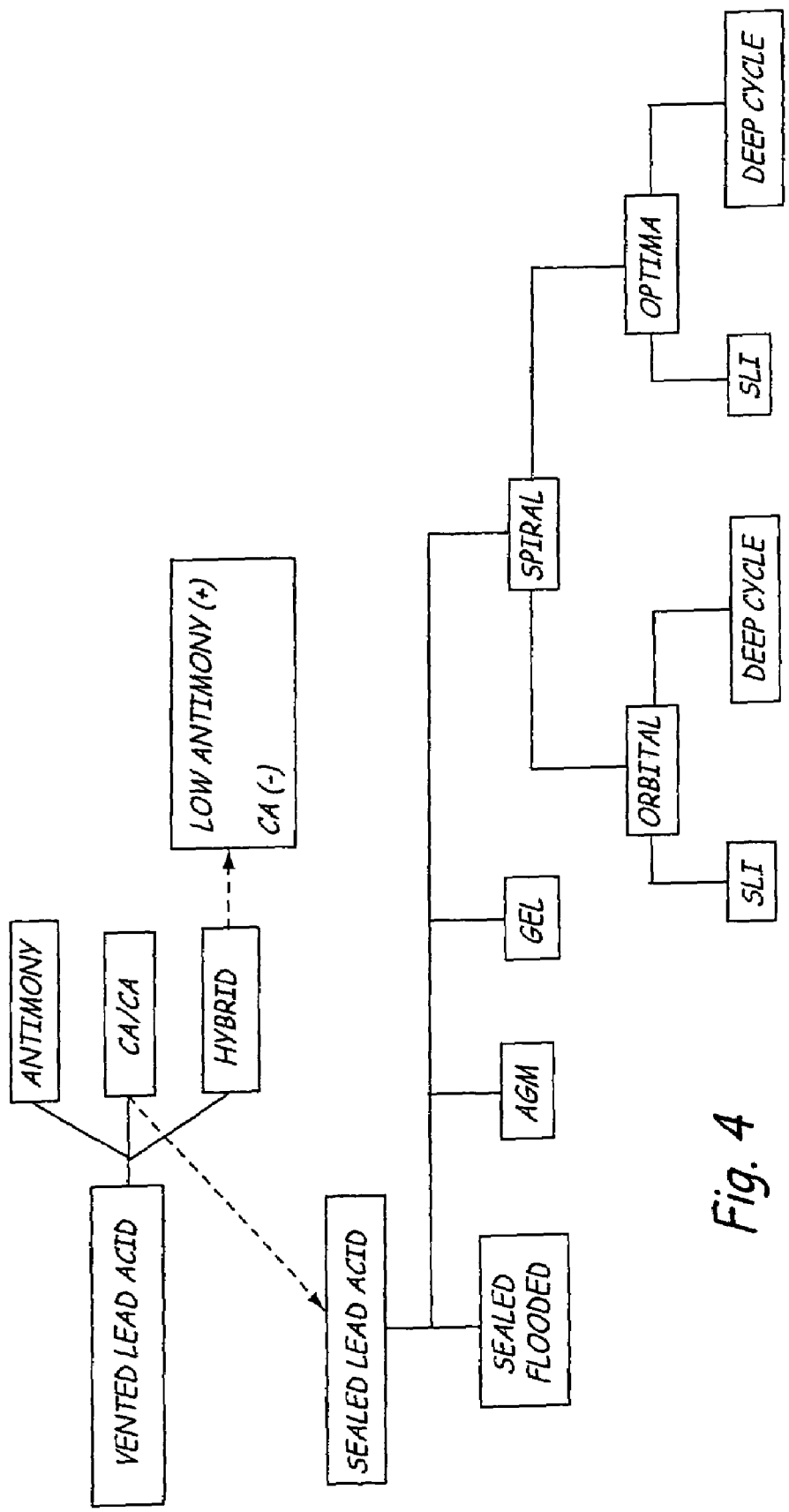
FIG. 4 is a diagram which illustrates various battery types.

FIG. 4 is an example of a query decision tree which can be used to identify the type of battery under test. FIG. 4 illustrate two main trees, vented lead acid and sealed lead acid. Within each of these main trees are various subgroups of batteries. Through a series of queries, such as what is the color of the battery, what descriptors are on the battery, does the battery have caps, what do the caps look like, is the liquid level within the battery visible, is there a "magic eye" visible on the battery, what type of brand labeling is present, what is the shape of the battery or cells within the battery, etc., the calculation circuitry 6 is able to walk through the decision tree shown in FIG. 4. As the operator responds to queries, the calculation circuitry 6 is able to specifically identify the type of battery under test. Once the particular battery type is determined, the calculation circuitry performed a test on the battery which is a function of the determined battery type. This allows the test to be tailored for the particular type of battery. An example of a user query is "Does the battery have vents?", "Does the battery have caps?", "Are the caps round or square?", "What is the color of the battery case?", etc. The user input can be, for example, selected from a number of options. The user input can be selected, for example, by touching the desired response on a screen, scrolling through the set of desired responses, pressing a button which is associated with the desired response, or other techniques.

The present invention may be implemented using any appropriate technique. For simplicity, a single technique has been illustrate herein. However, other techniques may be used including implementation in all analog circuitry. Additionally, by using appropriate techniques, any dynamic parameter can be measured. Further, in some embodiments, the test is not based on a dynamic parameter or is based on multiple parameters. With the present invention, a desired output level of the battery is obtained, for example through an input.

Various types of batteries include vented lead acid, sealed lead acid, vented lead acid, spiral, deep cycle, electrolyte gel cells, absorbed glass matt, valve regulated lead acid, Orbital brand, starting, lighting ignition batteries, Optima brand, sealed flooded, antimony, and hybrid. In one embodiment, if battery type cannot be determined, the battery tester will assume that it is a AGM battery type.

Although the present invention has been described with reference to preferred embodiments, workers skilled in the art will recognize that changes may be made in form and detail without departing from the spirit and scope of the invention. For example, date codes, weight, logos or other indicia can be used in identification. The tester can provide a graphical display to assist in the identification of battery type.

What is claimed is:

1. A method of performing a battery test using an electronic battery tester, comprising:
   connecting the electronic battery tester to a storage battery;
   receiving a query from the electronic battery tester regarding an observable physical characteristic of the battery;
   providing the electronic battery tester a response to the query related to the observerable physical characteristic; and
   receiving a battery test result from the electronic battery tester which is related to a measurement performed on the battery by the electronic battery tester and upon the response to the query.

2. The method of claim 1 wherein receiving a query comprises observing a display.

3. The method of claim 1 including retrieving the query from a memory.

4. The method of claim 1 wherein the measurement comprises a measurement of a dynamic parameter.

5. The method of claim 1 including coupling to the battery with Kelvin connection.

6. The method of claim 1 wherein the measurement is a function of an applied forcing function having a time varying signal.

7. The method of claim 1 including receiving a plurality of queries.

8. The method of claim 1 wherein the query relates to observable physical construction of the battery.

9. The method of claim 1 wherein the query relates to a shape of the battery.

10. The method of claim 1 wherein the query relates to a color of the battery.

11. The method of claim 1 wherein the query relates to caps on the battery.

12. The method of claim 1 wherein the query relates to a tube connected to the battery.

13. The method of claim 1 wherein the query relates to a visible liquid level of the battery.

14. The method of claim 1 wherein the query relates to a "magic eye" on the battery.

15. The method of claim 1 wherein the query relates to the brand label on the battery.

16. The method of claim 1 wherein the query relates to a battery type.

17. The method of claim 16 wherein the battery type comprises sealed lead acid.

18. The method of claim 16 wherein the battery type comprises vented lead acid.

19. The method of claim 16 wherein the battery type comprises spiral.

20. The method of claim 16 wherein the battery type comprises deep cycle.

21. The method of claim 16 wherein the battery type comprises an electrolyte gelatin.

22. The method of claim 16 wherein the battery type comprises an absorbed glass matt.

23. The method of claim 16 wherein the battery type comprises starting, lighting, ignition battery.

24. The method of claim 16 wherein the battery type comprises sealed flooded.

25. The method of claim 16 wherein the battery type comprises antimony.

26. The method of claim 16 wherein the battery type comprises hybrid.

27. The method of claim 1 wherein providing a responses comprises touching a desired response on a screen.

28. The method of claim 1 wherein providing a response comprises scrolling through a set of responses.

29. The method of claim 1 wherein providing a response comprises pressing a button.

* * * * *